(12) United States Patent
Lin

(10) Patent No.: US 6,184,580 B1
(45) Date of Patent: Feb. 6, 2001

(54) BALL GRID ARRAY PACKAGE WITH CONDUCTIVE LEADS

(75) Inventor: Shih-Hao Lin, Taichung (TW)

(73) Assignee: Siliconware Precision Industries Co., Ltd., Taichung (TW)

( * ) Notice: Under 35 U.S.C. 154(b), the term of this patent shall be extended for 0 days.

(21) Appl. No.: 09/394,263

(22) Filed: Sep. 10, 1999

(51) Int. Cl.[7] ................................................. H01L 23/34
(52) U.S. Cl. .................. 257/712; 257/706; 257/711; 257/712; 257/717; 257/718; 257/780
(58) Field of Search .................................. 257/706, 711, 257/712, 717, 718, 780

(56) References Cited

U.S. PATENT DOCUMENTS

| | | | |
|---|---|---|---|
| 5,397,917 | * | 3/1995 | Ommen et al. ................ 257/698 |
| 5,583,378 | * | 12/1996 | Marrs et al. ................... 257/710 |
| 5,724,230 | * | 3/1998 | Poetzinger .................... 361/758 |
| 5,726,493 | * | 3/1998 | Yamashita et al. ............ 257/698 |
| 5,796,038 | * | 8/1998 | Manteghi ..................... 174/52.4 |
| 5,854,511 | * | 12/1998 | Shin et al. ..................... 257/713 |
| 5,866,943 | * | 2/1999 | Mertol .......................... 257/712 |
| 5,886,408 | * | 3/1999 | Ohki et al. .................... 257/720 |
| 5,909,056 | * | 6/1999 | Mertol .......................... 257/704 |
| 5,926,371 | * | 7/1999 | Dolbear ........................ 361/704 |
| 6,020,637 | * | 2/2000 | Karnezos ...................... 257/738 |
| 6,046,499 | * | 4/2000 | Yano et al. ................... 257/712 |

* cited by examiner

Primary Examiner—Mahshid Saadat
Assistant Examiner—Edgardo Ortiz
(74) Attorney, Agent, or Firm—Jiawei Huang; J C Patents

(57) ABSTRACT

A ball grid array package with conductive leads comprising a silicon chip, a heat sink, a plurality of conductive leads, bonding wires, and solder balls, a substrate and a molding compound. The conductive leads and the substrate are positioned below the heat sink such that the conductive leads are sandwiched between one surface of the substrate and the heat sink. The heat sink has a die-attach region for attaching the silicon chip. The silicon chip is electrically connected to contact points on another surface of the substrate and the conductive leads by bonding wires. The conductive leads are directly mounted to a printed circuit board. The contact points on the other surface of the substrate are electrically connected to the printed circuit board through trace lines inside the substrate and the solder balls attached to some of the contact points. The bonding wires, a portion of the conductive leads, and the silicon chip are enclosed by the molding compound for better protection.

11 Claims, 2 Drawing Sheets

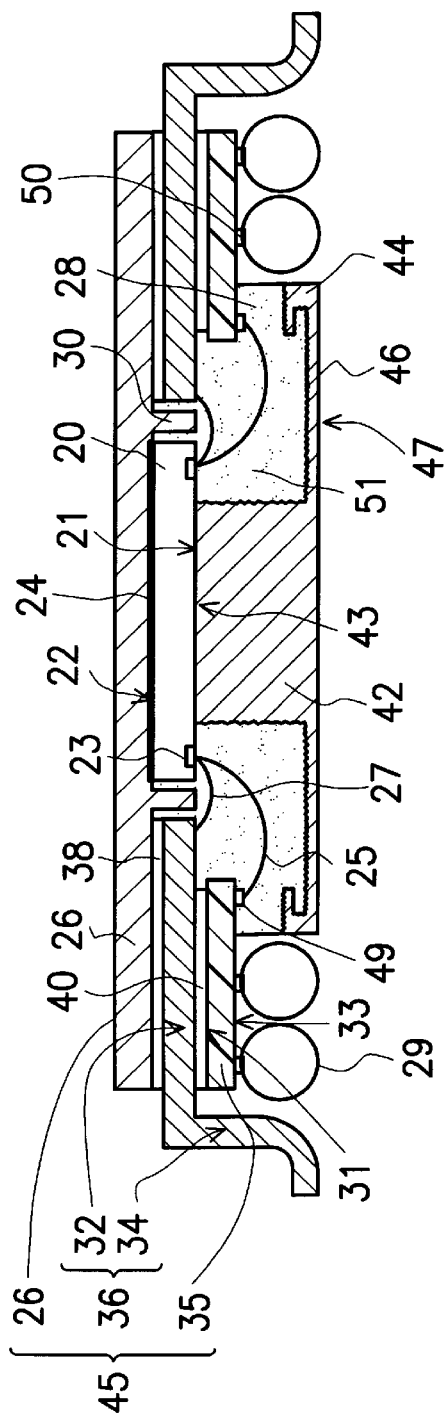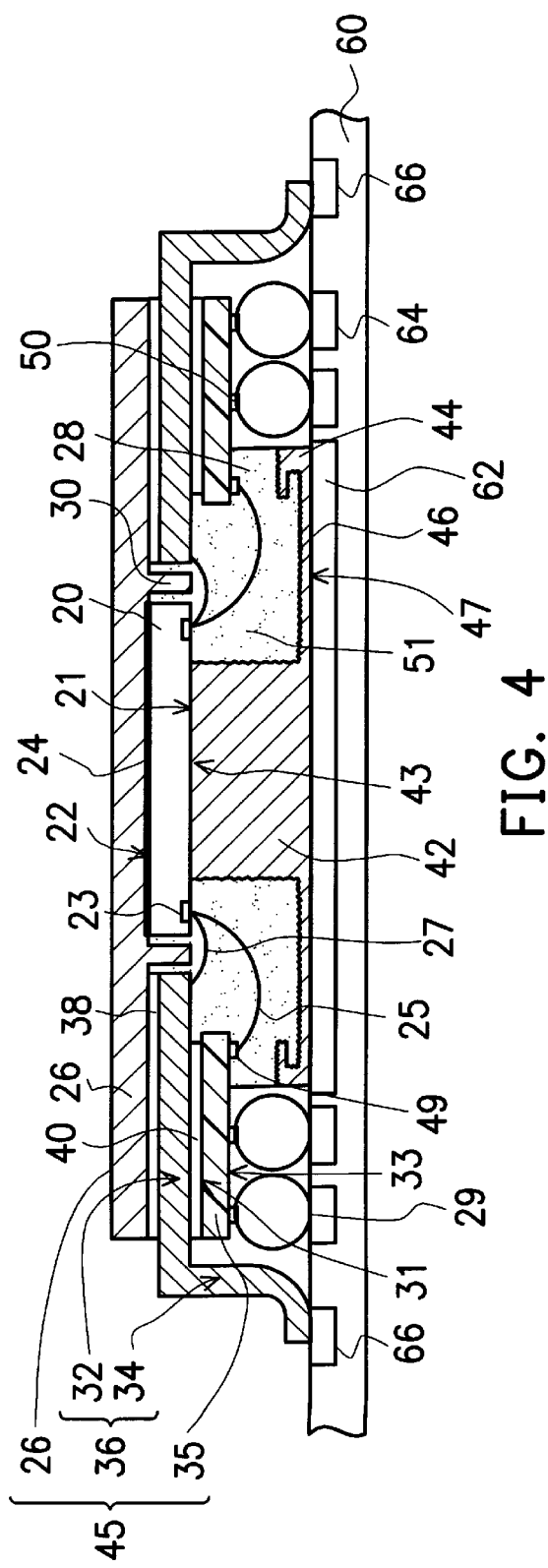

BALL GRID ARRAY PACKAGE WITH CONDUCTIVE LEADS

BACKGROUND OF THE INVENTION

1. Field of Invention

The present invention relates to a packaging structure for a silicon chip. More particularly, the present invention relates to a ball grid array package with conductive leads.

2. Description of Related Art

In the manufacturing of integrated circuits, ultimate size of the package is an important issue. As the level of integration and functions of integrated circuits increase, the number of conductive leads required for connections with external circuitry are also increased. Furthermore, as the operating speed of silicon chip continue to increase, the amount of heat generated by the chip and electrical interference caused by external electromagnetic fields during operation can no longer be ignored. An increase in the level of integration leads to an increase in conductive lead-count under the same chip volume. However, when the number of conductive leads increases, distance between neighboring leads have to become smaller, thereby increasing the level of difficulties in packaging a silicon chip. Consequently, a packaging structure has been developed from the peripheral-arranged leadframe structure to a high-density area array structure. A typical high-density area array structure is the ball grid array (BGA) structure. To further reduce the footprint requirement of a ball grid array assembly and increase the number of conductive leads available, a ball grid array structure having additional conductive leads around the periphery of the package has been developed as well. Nonetheless, the thermal efficiency and the electromagnetic interference problems need to be carefully considered in the design of a high-density area array package.

FIG. 1 is a schematic, cross-sectional view showing a typical ball grid array package having a heat sink and conductive leads. As shown in FIG. 1, a silicon chip 10 is mounted on a surface of substrate 12. A heat sink 16 is directly mounted on top of the silicon chip 10 so that heat generated by the chip 10 during operation can be conducted away rapidly. The conductive leads 14 are mounted on the substrate 12 and surrounding the chip 10. A back surface of the chip 10 is thermally coupled to some solder balls 19' on another surface of the substrate 12 so that heat can also be conducted away, In general, the substrate 12 is laminated with each layer includes some conductive traces. Different trace layers are electrically connected by vias. Furthermore, the trace layer located on the surface of the substrate 12 possesses contact points 13 for electrical connections with the silicon chip 10. A plurality of solder balls 19 is placed on the other side of the substrate 12 for electrical connections with a printed circuit board. The silicon chip 10 is electrically connected to the contact points 13 and the conductive leads 14 through electrical wires 15 and 17, respectively. Hence, electrical signals within the chip 10 are able to pass onto the substrate 12 and the conductive leads 14. A molding compound 18 encloses the silicon chip 10 and the wires 15 and 17. The molding compound 18 also fills the space between the heat sink 16, the chip 10, the conductive leads 14, and the substrate 12 while exposing a surface of the heat sink 16. Thus, the chip 10, the substrate 12, and inner portion of the leads 14 are protected while heat can be conducted away through the exposed surface of the heat sink 16.

The aforementioned package structure not only has an area array of solder balls, but also contains a plurality of conductive leads 14 coming out from the edge of the package. Hence, the package can have a relatively small footprint while the number of connections is maintained. However, the heat sink 16 is a structure that floats above the silicon chip 10, and electric charges may accumulate. Thereby, a parasitic capacitance may be generated leading to the distortion of signals from the chip 10.

SUMMARY OF THE INVENTION

Accordingly, a first object of the present invention is to provide a ball grid array package with conductive leads, which improves the thermal efficiency of the package.

A second object of the invention is to provide a ball grid array package with conductive leads, which prevents interference of external electromagnetic fields.

A third object of the invention is to provide a ball grid array package with conductive leads, which eliminates a parasitic capacitor between the chip, or the wires, and the heat sink. Hence, the performance of the package can be improved.

A fourth object of the invention is to provide a ball grid array package with conductive leads, which increases the reliability and the yield of a surface mounting operation.

A fifth object of the invention is to provide a ball grid array package with conductive leads having cavity down packaging structure, which decreases the overall thickness of the package.

To achieve these and other advantages and in accordance with the purpose of the resent invention, as embodied and broadly described herein, the present invention provides a ball grid array package with conductive leads. The package includes a silicon chip, a pair of heat sinks, a plurality of conductive leads, a substrate, a plurality of solder balls, and a molding compound. The silicon chip is supported by a carrier. The carrier is an assembly that includes a first heat sink having an exposed surface and a bottom surface, the conductive leads, and the substrate. The conductive leads are sandwiched between the bottom surface of the first heat sink and a surface of the substrate. The conductive leads and the substrate are positioned below the first heat sink and surrounded a die-attach region on the bottom surface of the first heat sink. A back surface of the silicon chip is attached to the die-attach region on the bottom surface of the first heat sink. Since the conductive leads are ultimately connected to a printed circuit board, some of the heat generated by the chip can be conducted away through the conductive leads. In addition, since the first heat sink can be grounded through a lead connection to the printed circuit board, most of the external electromagnetic fields can be screened. A plurality of solder balls is placed on another surface of the substrate. The solder balls are electrically connected to the chip by means of trace lines within the substrate and bonding wires. Since an active surface of the chip and the solder balls are on the same side, this is a cavity down package. Electrical connections between the solder balls and the chip are achieved by bonding wires which are accommodated in spaces between the substrate, and the solder balls. Hence, no additional space for accommodating the bonding wires is required. The molding compound encloses spaces between the chip and the conductive leads, the substrate, and the solder balls.

To increase the heat dissipation capacity of the package, a second heat sink can be mounted on the active surface of the silicon chip. The second heat sink only covers a portion of the active surface and exposes a bonding pads region on the active surface. A molding compound then fills the space between a rugged surface of the second heat sink, the chip, the conductive leads, and the substrate. An exposed surface of the second heat sink is on the same horizontal level as outer portion of the conductive leads. Thus, the exposed surface is in contact with the printed circuit board on which the package is mounted. The rugged surface is between the exposed surface and a mounting surface so that the second heat sink is solidly mounted when the space is filled by the molding compound. In addition to high heat dissipation capacity, the second heat sink, the first heat sink, and the conductive leads together form an ideal shield as well for external electromagnetic radiation. Hence, the silicon chip is able to operate more reliably at a high voltage and high frequency.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 3 is a schematic, cross-sectional view showing a ball grid array package with conductive leads according to another embodiment of the present invention; and FIG. 4 is a schematic, cross-sectional view showing the ball grid array package with conductive leads according to the other embodiment of the present invention mounted on a printed circuit board.

DESCRIPTION OF THE PREFERRED EMBODIMENTS

Figure 1:
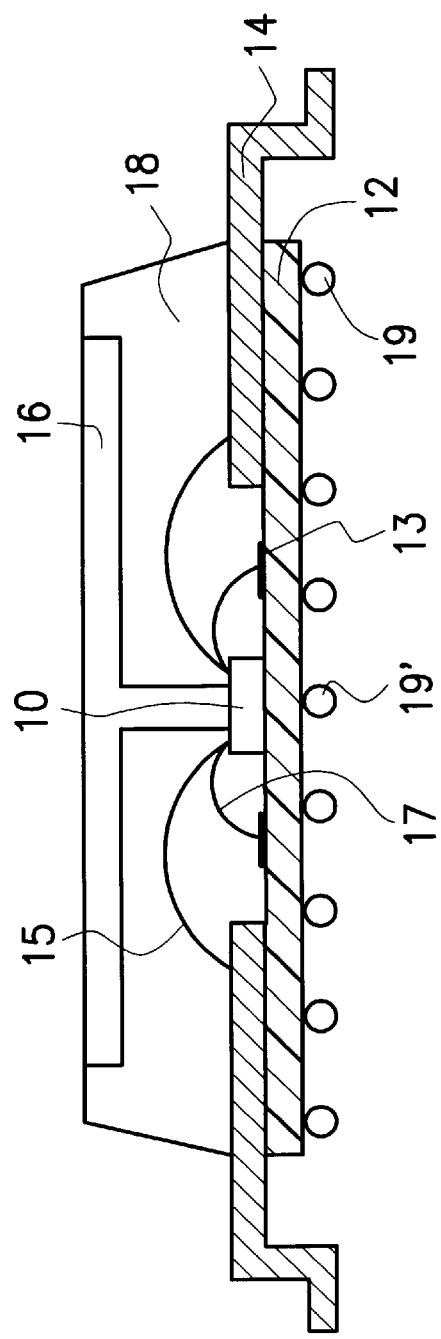
FIG. 1 is a schematic, cross-sectional view showing a conventional ball grid array package with conductive leads and a heat sink.

Reference will now be made in detail to the preferred embodiments of the present invention, examples of which are illustrated in the accompanying drawings. Wherever possible, the same reference numbers are used in the drawings and the description to refer to the same or like parts.

Figure 2:
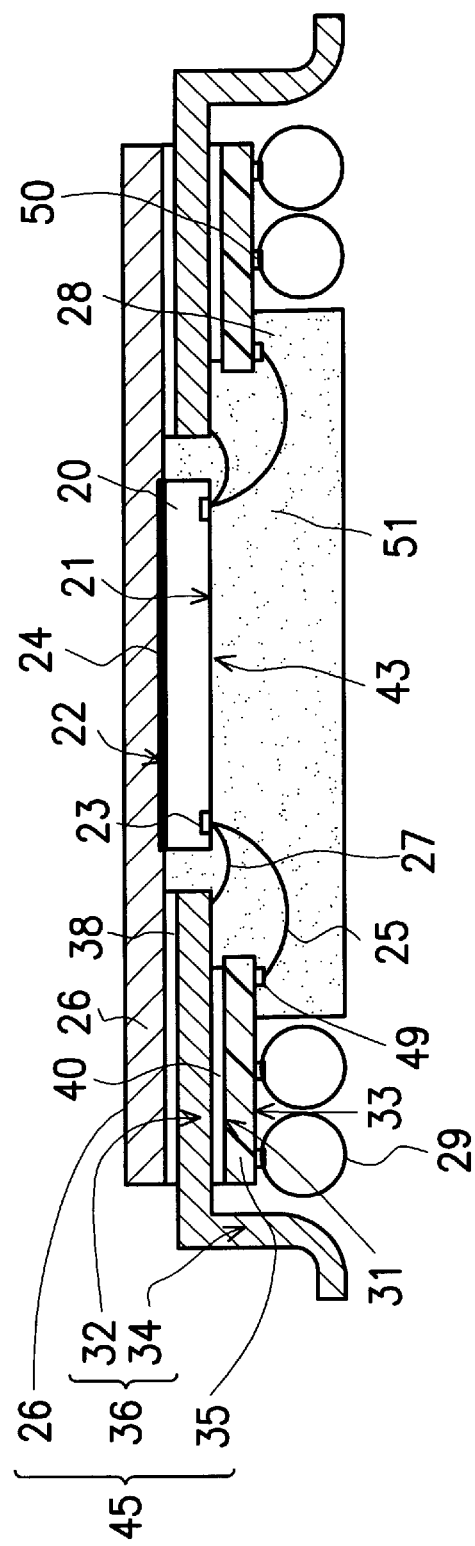
FIG. 2 is a schematic, cross-sectional view showing a ball grid array package with conductive leads according to an embodiment of the present invention.

FIG. 2 is a schematic, cross-sectional view showing a ball grid array package with conductive leads according to an embodiment of the present invention. FIG. 3 is a schematic, cross-sectional view showing a ball grid array package with conductive leads according to another embodiment of the present invention. FIG. 4 is a schematic, cross-sectional view showing the ball grid array package with conductive leads according to the other embodiment of the present invention mounted on a printed circuit board. As shown in FIGS. 2, 3 and 4, the package includes a silicon chip 20, a first heat sink 26, a second heat sink 42, a plurality of conductive leads 36, a substrate 35, a plurality of solder balls 29 and a molding compound 28.

The first heat sink 26, the conductive leads 36 and the substrate 35 together serve as a carrier 45 for the silicon chip 20. The conductive leads 36 are sandwiched between the first heat sink 26 and the substrate 35. The conductive leads 36 and the substrate 35 are positioned below the first heat sink 26 and surrounding a die-attach region 24. The die-attach region 24 is a region for attachment of the silicon chip 20 so that the silicon chip 20 and the carrier 45 are joined together. A back surface 22 of the silicon chip 20 is attached to the die-attach region 24 of the first heat sink 26 using conductive paste or insulating paste. The conductive leads 36 and the first heat sink 26 are attached together using an adhesive layer 38. Similarly, the conductive leads 36 and the substrate 35 are attached together using an adhesive layer 40. The adhesive layers 38 and 40 can be insulating paste, for example. Preferably, the adhesive layers to 38 and 40 have a thickness of about 0.064mm while the conductive leads have a thickness of about 0.127 mm.

Each conductive lead 36 is further divided into an inner lead portion 32 and an outer lead portion 34. The inner lead portion 32 is fixed on the first heat sink 36 by means of adhesive layer 38. Bonding pads 23 on an active surface 21 of the silicon chip 20 is electrically connected to the respective conductive leads 36 by a plurality of bonding wires 27. Since the conductive leads 36 are in contact with the first heat sink 26 and contact points 66 on a printed circuit board 60 as in FIG. 4, the conductive leads 36 are capable of conducting away a portion of the heat generated by the chip 20.

When a ball grid array package is mounted to the printed circuit board 60, some of the solder balls 29 may be collapsed. This is because the solder balls 29 are made of a lead-tin alloy. The solder balls 29 are easily collapsed especially when they are heated to a high temperature to initiate a reflow, and a pressure is applied to the package during a surface mounting operation. Since a collapsed solder ball can occupy a larger surface area, contacts with nearby solder balls may occur causing short circuit or open circuit problems. However, for the ball grid array package of this invention, the outer lead portion 34 of the conductive leads 36 is able to confer some resistance to the pressure applied on the package. Therefore, a suitable distance of separation between the package and the printed circuit board 60 can be maintained and the solder balls 29 are no longer collapsed. Hence, both the reliability and the yield are improved for the surface mounting operation.

The substrate 35 usually contains two or more layers of trace lines interconnected by vias (not shown) so that the silicon chip 20 is electrically connected to the solder balls 29. Additionally, the trace layers in the substrate are isolated from each other by insulating layers. A first surface 31 of the substrate 35 is in contact with the conductive leads 36, and a second surface 33 of the substrate 35 has contact points 49 and 50. Bonding pads 23 on the active surface of the silicon chip 20 are electrically connected to the contact points 49 by wires 25 while contact points 50 are in direct contact with the solder balls 29. Through the solder balls 29, the silicon chip 20 is connected to contact points 64 on the printed circuit board 60 so that transmission of signals between the chip 20 and the printed circuit board 60 is possible.

To secure the wires 25 and 27 on various contact points such as the bonding pads 23, the conductive leads 36, and the contact points 49 on the substrate 35, as well as to prevent accidental contacts between the wires, a molding compound 28 is injected to fill an internal space. The molding compound 28 can be, for example, an epoxy resin or a liquid compound.

Since the solder balls 29 have a definite height, some space remains after the package is mounted on the printed circuit board. Most conventional ball grid array packages rarely make use of this space except the placement of an additional heat sink. In this invention, the active surface 21 of the chip 20 and the solder balls 29 are on the same side of the first heat sink 26, a so-called cavity down package structure. Therefore, it is possible to accommodate the wires 25 and 27 in a spatial region 51 between the chip 20, the substrate 35, and the solder balls 29. The thickness of the package according to the present invention can be greatly reduced.

For most chip packages, increased heat dissipation capacity is one of the principle means for smoothing the operation of a package. For example, if the thermal efficiency of a central processing unit package is improved, better performance is expected during an ultra-high frequency operation. Hence, as shown in FIG. 3, a second heat sink 42 can be selectively added in this invention. The second heat sink 42 is in contact with the active surface 21 of the silicon chip 20 so that the chip 20 is sandwiched between the first heat sink 26 and the second heat sink 42. Thus, heat generated by the silicon chip 20 can be conducted away through the active surface 21 and the back surface 22 simultaneously. In general, a large portion of heat is generated near the active surface 21 of the silicon chip 20. Consequently, exposition of the active surface 21 is often more important than the back surface 22 of the chip 20. Thereby, a mounting surface 43 of the second heat sink 42 is in contact with the active surface 21 of the silicon chip 20. When the package is mounted on the printed circuit board 60, an exposed surface 47 of the second heat sink 42 is also in contact with a contact area 62 of the printed circuit board 60. Because the mounting surface 43 and the exposed surface 47 of the second heat sink 42 are relatively large, and metal is a good thermal conductor, heat generated by the silicon chip 20 can be rapidly conducted away. Hence, the performance of the chip 20 is improved.

Surrounding the die-attach region 24 of the first heat sink 26 is a first projection device 30. The first projection device 30 extends vertically into the molding compound 28 so that the first heat sink 26 and the molding compound 28 are able to adhere tightly with each other. Aside from better contact with the molding compound 28, the first projection device 30 also provides additional contact area with the heat sink 26 so that more heat can be carried away. Similarly, the second heat sink 42 has a rugged surface 46 so that the second heat sink 42 and the molding compound 28 are able to adhere tightly with each other. The rugged surface 46 is a roughened surface with many protrusions and recesses that enhances the capacity of the molding compound 28 to engage with the second heat sink 42. Obviously, the rugged surface 46 must be designed into a shape that can accommodate the wires 25 and 27. In addition, a second projection device 44 can be designed. The second projection device 44 can be a protrusion at the far edge of the second heat sink 42 forming a hook structure within the molding compound 28. Hence, adhesion between the second heat sink 42 and the molding compound 28 is further reinforced. In this invention, shapes of the first projection device 30, the rugged surface 46, and the second projection device 44 can all be modified. The shapes can be optimized in such a way that the adhesion force of the molding compound 28 and/or the heat dissipation capacity of the heat sinks 26, 42 is improved. Furthermore, shapes of the second heat sink 42 can also be modified by including some holes here or there to facilitate the packaging process such as molding or glob top.

In general, interference from external electromagnetic fields can be reduced by incorporating a grounded shield. However, effectiveness of the shield depends very much on sizes of any magnetic leak holes in the shield. After the package of this invention has been mounted on the printed circuit board 60, some of the conductive leads 36 and the second heat sink 42 are grounded through the printed circuit board 60. Since the conductive leads 36, the first heat sink 26, and the second heat sink 42 together form a grounded shield that completely encloses the silicon chip 20, the silicon chip 20 is entirely screened from the influence of external electromagnetic fields. External electromagnetic waves are then absorbed and transferred to the ground. Hence, the electromagnetic waves might no longer affect the chip 20. In a conventional chip packaging structure, some electric charges may accumulate when the heat sink is assembled in the package without touching a ground wire. Consequently, the heat sink and the printed circuit board together form a parasitic capacitor, and signal transmissions inside the chip may be affected. On the contrary, the first heat sink 26 and the second heat sink 42 of this invention are both grounded. No electric charges can accumulate on the first and the second heat sinks 26, 42 to form a parasitic capacitor.

The insulating layers in the substrate 35 can be made of cyanate material such as a rigid material including bis-maleimide triazine (BT) resin or glass epoxy-based resin (FR-4, FR-5). Alternatively, the insulating layers in the substrate 35 can be made of flexible material such as polyimide. The first and the second heat sinks 26, 42 can be made of copper, copper alloy, aluminum or aluminum alloy.

This invention is able to provide a high-density packaging structure. Using a package with 564 connections as an example, a conventional ball grid array package requires a substrate having an area of 35×35 $mm^2$ and four layers of trace lines. Yet, the package of this invention requires a substrate having an area of just 27×27 $mm^2$ (to accommodate 348 connections), a 27×27 $mm^2$ leadframe (to accommodate 216 connections) and two layers of trace lines. Hence, the package of this invention has a smaller footprint and a higher packing density. In addition, the cost of producing the carrier is saved by over a half.

Because the substrate, the leadframe, and the first heat sink can be previously attached together, conventional packaging process and equipment can be employed for the ball grid array package with conductive leads according to the present invention and no new machine is required.

Since the package of this invention contains two heat sinks, and the conductive leads are surrounding the silicon chip, heat can be dissipated away much quicker. Moreover, the two heat sinks, which enclose the silicon chip, are able to serve as an effective shield against external electromagnetic fields. Hence, the package is particularly suitable for housing a high frequency chip. In addition, by employing the solder balls and the conductive leads in a single package, the connection density can be increased while an overall area occupation of footprint is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A ball grid array package with conductive leads, comprising:

a first heat sink having an exposed surface, a bottom surface, and a die-attach region on the bottom surface of the first heat sink;

a plurality of conductive leads with each lead divided into an inner lead portion and an outer lead portion, wherein the inner lead portion of the conductive leads are in contact with the bottom surface of the first heat sink and surrounding the die-attach region and the outer lead portion of the conductive leads extend away from the bottom surface of the first heat sink;

a substrate having a first surface and a second surface, wherein the first surface is in contact with the conductive leads so that the inner lead portion of the conductive leads are sandwiched between the first heat sink and the substrate, and the second surface has a plurality of contact points;

a silicon chip attached on the die-attach region on the bottom surface of the first heat sink, wherein the silicon chip has an active surface and a back surface, and the back surface is in contact with the bottom surface of the first heat sink;

a plurality of bonding wires electrically connecting the inner lead portion of the conductive leads and some of the contact points on the second surface of the substrate to the active surface of the silicon chip;

a plurality of solder balls mounted on some of the contact points on the second surface of the substrate, wherein the outer lead portion of the conductive leads are further used to support the ball array package when the ball array package is attached to a circuit board; and a molding compound enclosing the bonding wires, the silicon chip, the inner lead portion of the conductive leads, and the contact points electrically connected to the silicon chip.

2. The package of claim 1, wherein the first heat sink further includes a first projection device that extends from the first heat sink into the molding compound.

3. The package of claim 1, wherein the package further includes a second heat sink having a mounting surface, a rugged surface and an exposed surface, with the mounting surface in contact with the active surface of the silicon chip, the rugged surface in contact with the molding compound, and the exposed surface exposed outside.

4. The package of claim 3, wherein the rugged surface includes a roughened surface.

5. The package of claim 3, wherein the second heat sink further includes a second projection device at the junction between the exposed surface and the rugged surface, and extends into the molding compound.

6. The package of claim 1, wherein the substrate is formed as laminated layers of a plurality of trace layers and at least one insulating layer.

7. The package of claim 6, wherein the insulating layer is made of cyanate.

8. The package of claim 6, wherein the insulating layer is made of glass epoxybased resin.

9. The package of claim 6, wherein the insulating layer is made of polyimide.

10. The package of claim 1, wherein the first and the second heat sinks are made of copper, copper alloy, aluminum, or aluminum alloy.

11. A ball grid array package with conductive leads, comprising:

a first heat sink having an exposed surface, a bottom surface, and a die-attach region on the bottom surface of the first heat sink;

a plurality of conductive leads with each lead divided into an inner lead portion and an outer lead portion, wherein the inner lead portion of the conductive leads are in contact with the bottom surface of the first heat sink and surrounding the die-attach region and the outer lead portion of the conductive leads extend away from the bottom surface of the first heat sink;

a substrate having a first surface and a second surface, wherein the first surface is in contact with the conductive leads so that the inner lead portion of the conductive leads are sandwiched between the first heat sink and the substrate, and the second surface has a plurality of contact points;

a silicon chip attached on the die-attach region on the bottom surface of the first heat sink, wherein the silicon chip has an active surface and a back surface, and the back surface is in contact with the bottom surface of the first heat sink;

a plurality of bonding wires electrically connecting the inner lead portion of the conductive leads and some of the contact points on the second surface of the substrate to the active surface of the silicon chip;

a plurality of solder balls mounted on some of the contact points on the second surface of the substrate;

a molding compound enclosing the bonding wires, the silicon chip, the inner lead portion of the conductive leads, and the contact points electrically connected to the silicon chip; and a second heat sink having a mounting surface, a rugged surface and an exposed surface, with the mounting surface in contact with the active surface of the silicon chip, the rugged surface in contact with the molding compound, and the exposed surface exposed outside.

* * * * *